United States Patent
Dobyns

(10) Patent No.: US 8,324,885 B2
(45) Date of Patent: Dec. 4, 2012

(54) MIXED SIGNAL ACQUISITION SYSTEM FOR A MEASUREMENT INSTRUMENT

(75) Inventor: Kenneth P. Dobyns, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 430 days.

(21) Appl. No.: 12/561,908

(22) Filed: Sep. 17, 2009

(65) Prior Publication Data

US 2011/0066402 A1 Mar. 17, 2011

(51) Int. Cl.
*G01R 13/20* (2006.01)

(52) U.S. Cl. .................. 324/121 R; 324/76.11; 702/187

(58) Field of Classification Search ............... 324/76.11, 324/121 R; 702/187
See application file for complete search history.

(56) References Cited

U.S. PATENT DOCUMENTS

| | | | |
|---|---|---|---|
| 4,365,302 A * | 12/1982 | Elms | ............................... 702/61 |
| 5,710,517 A | 1/1998 | Meyer | |
| 5,748,124 A | 5/1998 | Rosenthal et al. | |
| 6,402,565 B1 | 6/2002 | Pooley et al. | |
| 7,352,167 B2 * | 4/2008 | Sullivan et al. | ............ 324/121 R |
| 2003/0141879 A1 * | 7/2003 | Wilsher | ........................ 324/601 |
| 2006/0284746 A1 * | 12/2006 | Huang et al. | .................... 341/50 |

FOREIGN PATENT DOCUMENTS

| | | |
|---|---|---|
| EP | 1434354 A2 | 6/2004 |
| EP | 1847842 A1 | 10/2007 |

* cited by examiner

*Primary Examiner* — Arleen M Vazquez

(74) *Attorney, Agent, or Firm* — Tetsuo Koyama; Thomas F. Lenihan

(57) ABSTRACT

A mixed signal acquisition system for a test and measurement instrument allows configuring of the number of analog and digital channels in use. The instrument includes an analog input interface and an N-channel logic input interface for receiving an analog signal and an N-channel logic signal, respectively. An A/D converter converts the analog input signal into an N-bit digital signal, and N latch circuits latch the N-bit logic signal. A multiplexer selects either the N-bit digital signal from the A/D converter, or the N-bit logic signals from the N latch circuits, and the selected signal at the output of the multiplexer is stored in an acquisition memory. By controlling the multiplexer selection, the number of analog channels and the digital channels can be controlled.

11 Claims, 6 Drawing Sheets

MIXED SIGNAL ACQUISITION SYSTEM FOR A MEASUREMENT INSTRUMENT

FIELD OF THE INVENTION

The present invention relates to the field of Test and Measurement Instruments, and more particularly to a system for acquiring mixed signals including analog signals and logic signals.

BACKGROUND OF THE INVENTION

Measurement instruments for acquiring both analog signals and logic or digital signals and displaying the acquired signals are well known as mixed signal oscilloscopes. The mixed signal oscilloscopes have become ubiquitous of late. These instruments augment traditional oscilloscope capabilities with the addition of digital signal capture. Therefore, such instruments are regarded as a combination of an oscilloscope and a "mini logic analyzer" wherein an acquisition timing of the analog signals is aligned with that of the logic signals. The "mini logic analyzer" channels extend the acquisition to more channels, suitable for use on logic signals. These extra channels can provide valuable insight when debugging embedded systems.

Referring now to FIG. 1, a perspective view of a conventional mixed oscilloscope 10 is illustrated. The mixed oscilloscope 10 comprises the mini logic analyzer circuit and the oscilloscope circuit within a housing 12 and further comprises four analog input interface 14 and a logic input interface 16 having 8-channel input terminals on a front panel of the housing 12. The front panel includes a display screen 18 and plural control knobs and push buttons. FIG. 2 shows a magnified view of one of analog input interfaces 14 wherein this interface comprises a BNC type input connector 20 and six auxiliary contacts 22 for recognizing a probe type, applying power to the probe, communicating between the probe and the oscilloscope 10. The basic principle of this analog interface is discussed in U.S. Pat. No. 6,402,565 (William R. Pooley, et al.), issued 11 Jun. 2002, entitled "Electronic Interconnect Device for High Speed Signal and Data Transmission", and assigned to the same assignee as is the subject invention.

FIG. 3 is a block diagram of the conventional mixed signal oscilloscope 10. Four channel analog input signals at four connectors 200-203 of the analog input interface 14 are applied to conditioning circuits 240-243 for conditioning amplitudes or the like of the input signals. The conditioned analog signals are digitized by analog-to-digital (A/D) converters 260-263 into, for example, 8-bit digital signals respectively. These digital signals are stored in an acquisition memory 30 through decimators 280-283. Eight channel logic input signals at eight connectors 160-167 of the digital interface 16 are applied to eight latch circuits 340-347 through eight comparators 320-327 respectively wherein comparators 322-325 and latch circuits 342-345 are not illustrated in FIG. 3 to simplify the drawing. Each of the comparators 320-327 compares the input logic signal with a predetermined threshold level to generate a "High" logic signal when the input logic signal is higher than the threshold level and a "Low" logic signal when the input logic signal is lower than the threshold level. These logic signals from the comparators 320-327 are latched by the latch circuits 340-347. The latched logic signals from the latch circuits 340-347 are stored in the acquisition memory 30 through an 8-bit decimator 36. A clock signal from a clock generator 40 is applied to the A/D converters 260-263 and the latch circuits 340-347 so that the logic acquisition timing is aligned with the analog acquisition timing.

The stored digital signals corresponding to the logic input signals and the analog input signals are transferred to a display controller/memory block 42 wherein the display controller rasterizes the digital signals, stores these signals in the display memory and then displays waveforms of the analog and logic input signals on the display screen 18. A controller 44 comprises a microprocessor 46, a memory 48 and an input device 50, such as the control knobs and push buttons shown in FIG. 1. The microprocessor 46 controls operations of blocks 240-243, 280-283, 36, 40, 30 and 42 in accordance with program stored in the memory 48 and instructions from the input device 50. Although a trigger circuit is not shown in FIG. 3 to simplify the drawing, the trigger circuit generates a trigger signal by comparing the signals from the conditioning circuits 240-243 or the output from the A/D converters 260-263 and/or the signals from the latch circuits 340-347 with a trigger condition set by the controller 44. The trigger signal controls which part of the input signals are stored in the acquisition memory 30.

One of the ongoing questions with mixed signal oscilloscopes is how many logic channels to provide. In the interest of simplicity and cost-effectiveness, most instruments have standardized on 16 additional logic channels although FIG. 3 shows only 8 logic channels. While this meets the needs of most customers, there are still applications where additional channels are needed. In addition, users often do not need all of the analog acquisition capabilities, particularly on a 4 channel mixed signal oscilloscope.

There are a number of "specialized" capabilities that have been, or are being added to oscilloscopes to extend their acquisition capabilities. These include, but are not limited to (1) high vertical resolution (10 or 12-bits) and (2) triggering and acquiring high-speed serial data signals. These capabilities are typically found in specialized instruments. There are a few high resolution products, but they are expensive and built by niche companies. The high-speed serial data acquisition has been limited to high-bandwidth oscilloscopes. Typically, the data acquisition is analog, with conversion to digital taking place as a secondary process.

What is needed is a system and method for allowing the user to configure the instrument, with respect to the number of analog and digital channels in use. In addition, what is needed is a method for providing specialized acquisition capabilities in the form of an accessory for mainstream mixed domain oscilloscopes.

SUMMARY OF THE INVENTION

Accordingly, the present invention provides a mixed signal acquisition system for a measurement instrument that allows the user to configure the instrument, with respect to the number of analog and digital channels in use. An analog input interface and a logic input interface having N terminals are mounted on a panel of the measurement instrument for receiving an analog signal and logic signals respectively wherein N is a positive integer and is, for example, eight. An analog-to-digital (A/D) converter converts the analog input signal from analog input interface to an N-bit digital signal and N latch circuits latch the logic signals from the N terminals of the logic input interface respectively. A multiplexer selects one of the N-bit digital signal from the A/D converter and the N logic signals from said N latch circuits. The output from the multiplexer is stored in a memory.

In addition, the present invention provides a measurement instrument for measuring mixed signals, that comprises a plurality of acquisition systems for acquiring the mixed signals and a display system for displaying the mixed signals acquired by the acquisition systems. Each of acquisition systems comprises an analog input interface, an A/D converter, a logic input interface having N terminals, N latch circuits, a multiplexer and a memory as described hereinbefore.

Moreover, the present invention provides a method of acquiring mixed signals. An analog input signal is converted into an N-bit digital signal by a first A/D converter when the analog input signal is applied to an analog input interface. N logic signals are latched by N latch circuits when the N logic signals are applied to a logic input interface having N logic input terminals. One of the N-bit digital signal from the A/D converter and the N logic signals from the N latch circuits is selected by a multiplexer. The output from the multiplexer is stored in a memory. In one embodiment of the present invention, the analog input signal is converted into an M-bit digital signal by a second A/D converter instead of the first A/D converter wherein M is a positive integer larger than N. The M-bit digital signal is transmitted via the logic input interface, the N latch circuits and the multiplexer to the memory in an interleave manner. In a second embodiment of the present invention, a clock signal is recovered from a serial logic signal, the serial logic signal is decoded and a trigger event is recognized from the serial logic signal. The decoded signal is transmitted via the logic input interface to the measurement instrument and the trigger event is transmitted via said analog input interface to the instrument.

The objects, advantages and other novel features of the present invention are apparent from the following detailed description when read in conjunction with the appended claims and drawing.

DETAILED DESCRIPTION OF THE DRAWING

Figure 4:
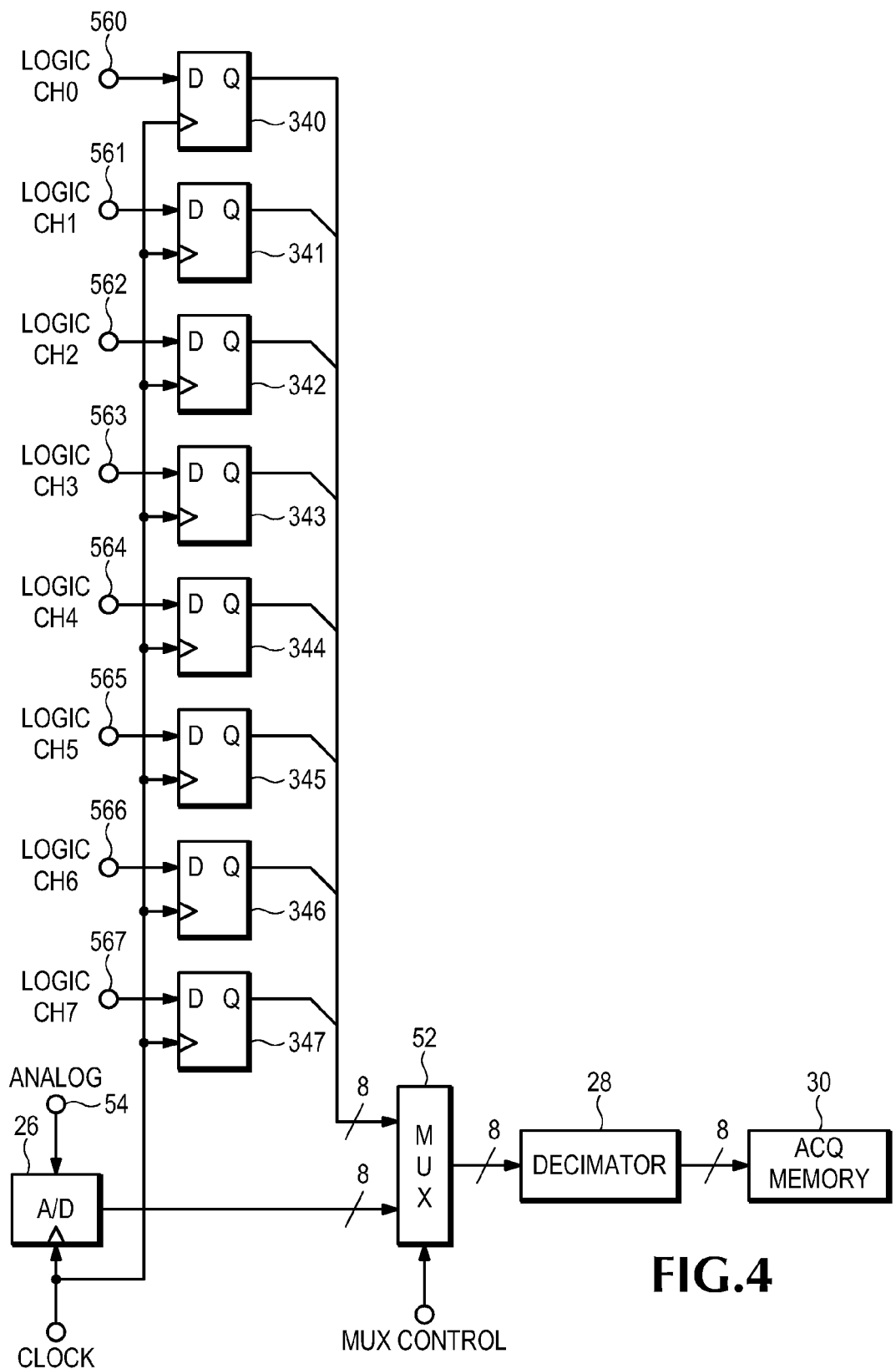
FIG. 4 is a block diagram of an acquisition system used by the present invention.

FIG. 4 is a block diagram of an acquisition system or a chipset used for the present invention wherein similar reference numbers have been employed to designate like elements of the previous drawings. This chipset includes an analog channel and a digital channel. In the analog channel, an A/D converter 26 converts an analog input signal at an analog terminal 54 into an N-bit digital signal wherein a sample timing is determined in accordance with a clock signal. The N is a positive integer and is, in this example, eight. The digital channel comprises N or eight latch circuits 340-347 that may be D flip-flops having D inputs for receiving logic signals at terminals 560-567 respectively. The latching timing of these latch circuits 340-347 is determined by the clock signal. Since the same clock signal for the A/D converter 26 is used as the latch timing for the latch circuits 340-347, the acquisition timing of the A/D converter 26 is aligned with that of the latch circuits 340-347.

A multiplexer (MUX) 52 receives the 8-bit digital signal from the A/D converter 26, the latched digital signals from Q terminals of the eight latch circuits 340-347 as the 8-bit latched digital signal, and a multiplexer control signal. The multiplexer 52 selects one of the 8-bit digital signal from the A/D converter 26 and the 8-bit digital signal from the latch circuits 340-347 in accordance with the multiplexer control signal. An electrical switch is desirable for the multiplexer 52 but a mechanical switch is available if necessary. The 8-bit digital output signal from the multiplexer 52 is applied through a decimator 28 to an acquisition memory 30 so that the 8-bit digital signal is stored in the memory 30. The chipset shown in FIG. 4 can be configured by an ASIC (application specific integrated circuit).

This architecture, illustrated in FIG. 4, allows the same chipset to be used to acquire either analog channels or digital channels. As described hereinbefore, the 8 digital channels, clocked at the same time as any of the analog channels, are passed to the same decimation circuit, or decimator 28, and data storage circuitry or the acquisition memory 30. This makes the design of digital channel acquisition a relatively simple extension of the design of analog channel acquisition.

This architecture of FIG. 4 can be used in a measurement instrument such as a mixed signal oscilloscope. If the multiplexer 52 were fixed to select only the latch circuits 340-347, then the chipset shown in FIG. 4 could be used only for the digital channels and the A/D converter 26 would not be used. On the other hand, if the multiplexer 52 were fixed to select only the A/D converter 26, then the chipset could be used only for the analog channel and the latch circuits 340-347 would not be used. However, this mixed signal oscilloscope would then have a fixed split between analog and digital channels, as does the apparatus of FIG. 3, typically arranged as 4 analog channels+8 digital channels.

Figure 5:
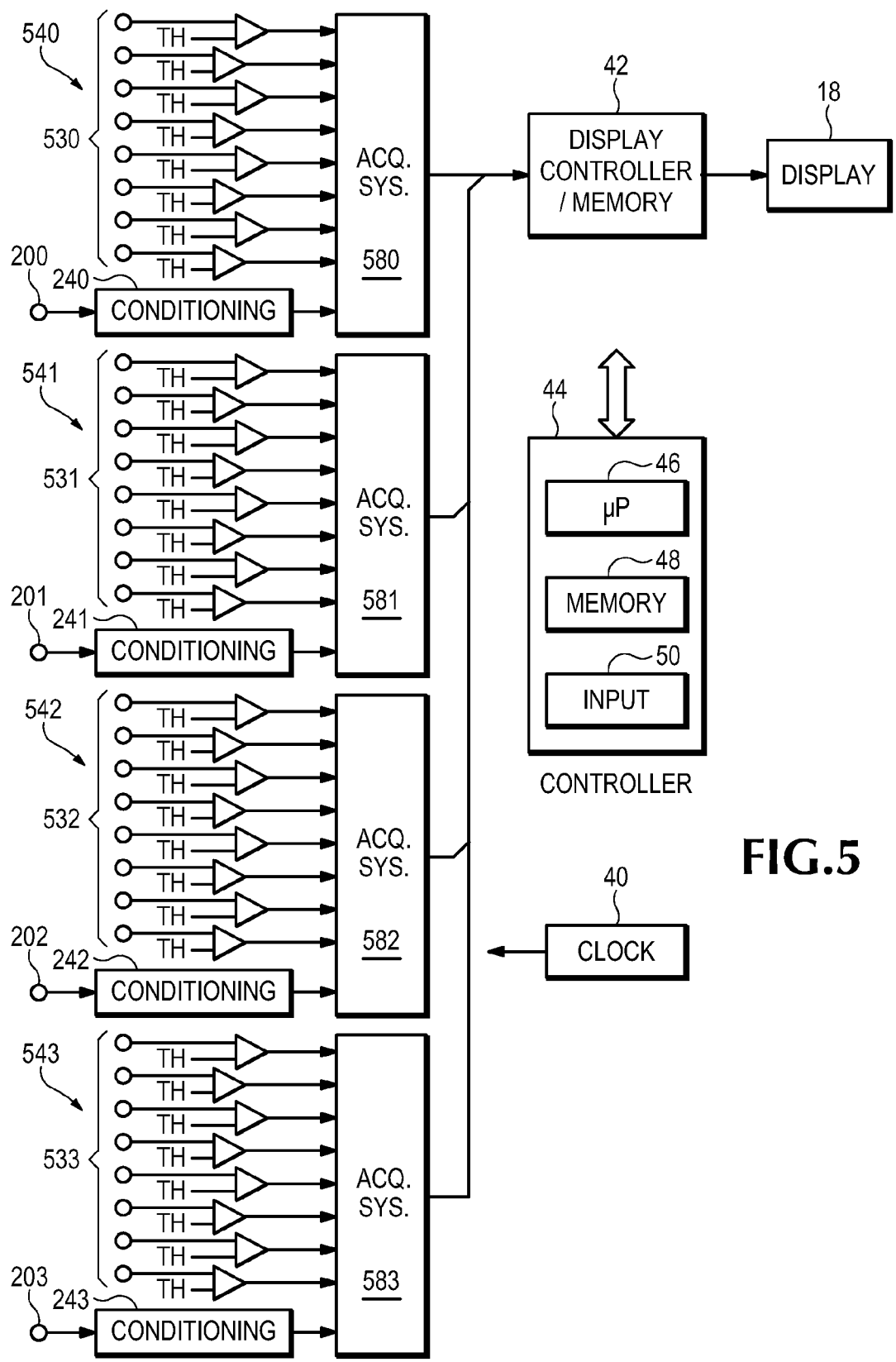
FIG. 5 is a simplified block diagram of one embodiment according to the present invention.

The present invention uses the chipset or the acquisition system shown in FIG. 4 by making the most use of the multiplexer 52. FIG. 5 is a simplified block diagram of one embodiment according to the present invention wherein similar reference numbers have been employed to designate like elements of FIG. 3. In FIG. 5, each of chipsets 580, 581, 582 and 583 is the same as one shown in FIG. 4. The logic terminals 560-567 of the chipset 580 (refer to FIG. 4) receive outputs from eight comparators 540 that compare input logic signals at eight logic input terminals 530 with a predetermined threshold level TH. The analog terminal 54 of the chipset 580 (refer to FIG. 4) receives an output from a conditioning circuit 240 that receives an analog input signal at an analog input terminal 200. Similarly to the chipset 580, the chipset 581 receives at its logic terminals 560-567 logic input signals from eight logic input terminals 531 via eight comparators 541 and further receives at its analog terminal 54 an analog input signal from an analog input terminal 201 via a conditioning circuit 241. The chipset 582 receives at its logic terminals 560-567 logic input signals from eight logic input terminals 532 via eight comparators 542 and further receives at its analog terminal 54 an analog input signal from an analog input terminal 202 via a conditioning circuit 242. Moreover, the chipset 583 receives at its logic terminals 560-567 logic input signals from eight logic input terminals 533 via eight comparators 543 and further receives at its analog terminal 54 an analog input signal from an analog input terminal 203 via a conditioning circuit 243.

Figure 3:
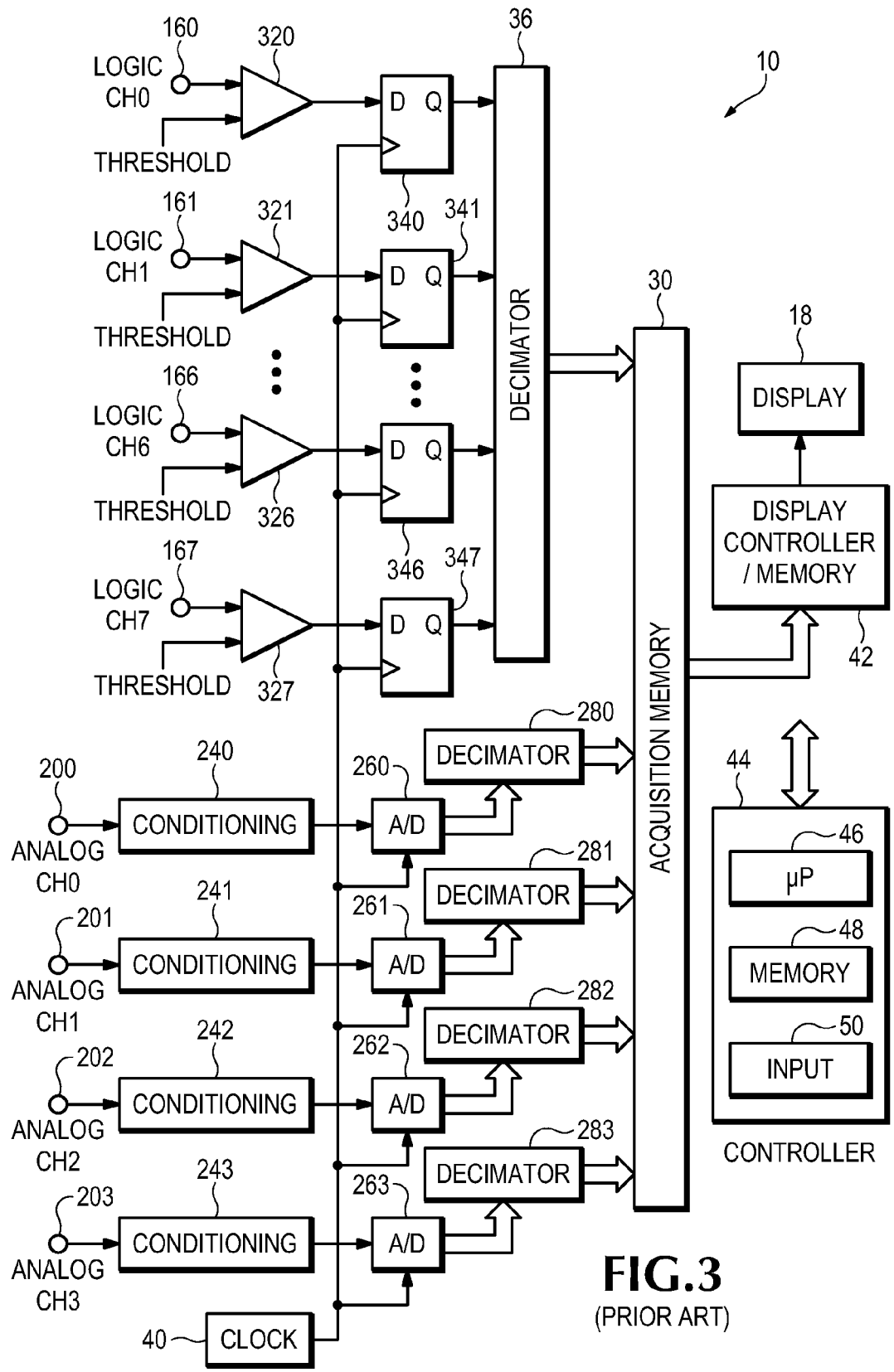
FIG. 3 is a simplified block diagram of the conventional measurement instrument shown in FIG. 1.

Similarly to FIG. 3, the acquisition memory 30 of the chipsets 580-583 are coupled to a display system comprising a display controller/memory block 42 and a display device 18. The display controller/memory block 42 displays the stored signals as analog waveforms and logic waveforms on a display screen 18. A controller 44 comprises a microprocessor 46, a memory 48 and an input device 50 such as control knobs and push buttons provided on a panel of the measurement instrument. A clock generator 40 generates a clock signal under control of the controller 44 and applies the clock signal to the chipsets 580-583. The controller 44 generates multiplexer control signals to be applied to the chipsets 580-583. A trigger circuit is not shown in FIG. 5 to simplify the drawing and its function is the same as one described hereinbefore by reference to FIG. 3.

Figure 1:
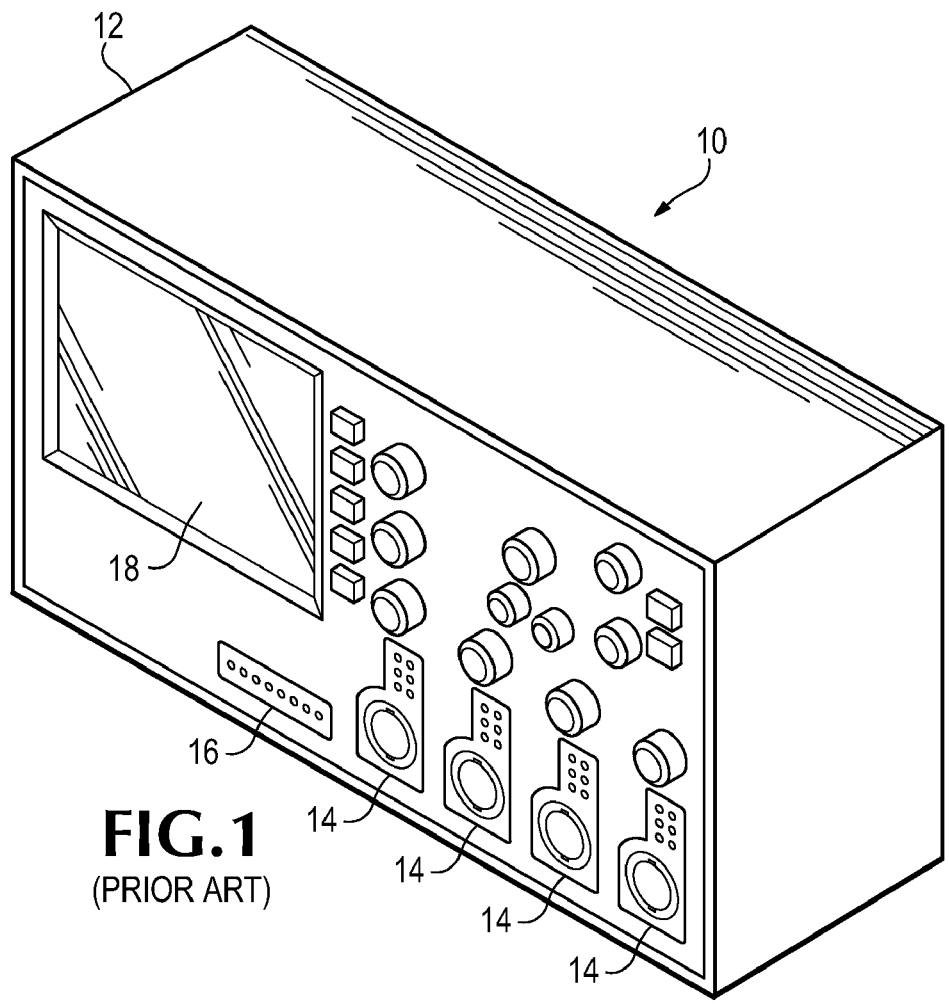
FIG. 1 is a perspective view of a conventional instrument for measuring mixed signals.
Figure 2:
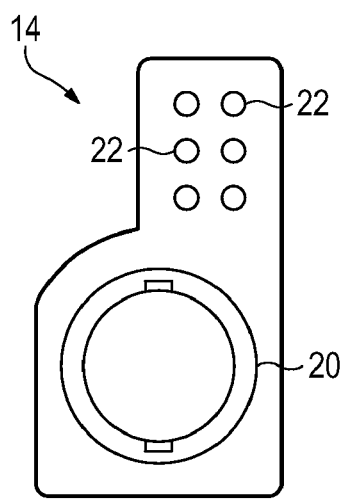
FIG. 2 is a magnified plan view of an analog input interface mounted on the conventional measurement instrument shown in FIG. 1.
Figure 6:
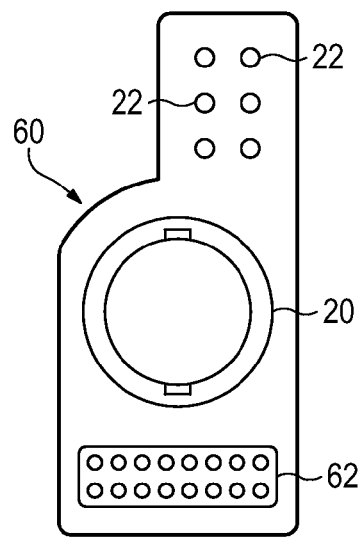
FIG. 6 is a magnified plan view of an input interface mounted on the measurement instrument of the present invention.

FIG. 6 is a magnified plan view of an input interface 60 used for the present invention. The input interface 60 comprises a digital input interface 62 and an analog interface having a BNC type analog input connector 20 and six auxiliary contacts 22. It should be noted that the logic input interface is provided adjacent to the analog input interface. The analog input connector 20 corresponds to each of analog input terminals 200-203 and the six auxiliary contacts 22 are coupled to the controller 44. The analog input interface is similar to conventional one shown in FIG. 2 and provides power and communications, in addition to the traditional analog signal interface. These probe interfaces provide multiple benefits to the user, including (1) direct connection of probes requiring power, such as active and differential probes, (2) automatic setup of the instrument parameters, such as scale factor, and (3) the ability to support "accessories", such as active terminations. The logic input interface 62 comprises 8 channel input terminals corresponding to the logic input terminals 530-533 wherein these input terminals may be for a differential signal type or a single ended type with ground.

Referring to FIGS. 4, 5 and 6, the operation of the acquisition system 580 will be described hereinafter because this operation can be applied to the acquisition systems 581, 582 and 583. When an analog probe is connected to the analog input connector 200 or 20, the controller 44 makes the multiplexer 52 select the A/D converter automatically by sensing the analog probe connection via the auxiliary contact 22 or by receiving instruction from the input device 50. The analog input signal at the input terminal 200 is buffered and its amplitude or vertical gain is adjusted by the conditioning circuit 240. The analog output from the conditioning circuit 240 is converted into an 8-bit digital signal by the A/D converter 26 wherein the sample timing is controlled by the clock signal whose frequency may be fixed to the maximum frequency for the A/D converter 26. Since the multiplexer 52 selects the A/D converter 26, the 8-bit digital signal is applied through the multiplexer 52 to the decimator 28 so that the digital signal is decimated in accordance with the timing resolution set by the controller 44. The decimated digital signal is stored in the acquisition memory 30.

When an 8-channel logic probe is connected to the logic input interface 62 or the eight logic input terminals 530, the controller 44 makes the multiplexer 52 select the eight latch circuits 340-347 automatically by sensing the logic probe connection via a sensor (not shown), via the auxiliary contact 22, or by receiving instruction from the input device 50. The eight logic signals at the logic input interface 62 or the eight input terminals 530 are compared with a predetermined threshold level TH by the eight comparators 540 respectively. The threshold level is controlled by the controller 44 by reference to the input logic family, such as TTL, ECL or the like. The logic output from the eight comparators 540 are latched by the latch circuits 340-347 respectively in response to the clock signal from the clock generator 40. Similarly to the analog signal acquisition, the clock frequency may be the maximum frequency for the latch circuits 340-347. Since the multiplexer 52 selects the latch circuits 340-347, the logic outputs or 8-bit logic signal from the latch circuits 340-347 are applied through the multiplexer 52 to the decimator 28 that decimates the 8-bit logic signal in accordance with the timing resolution set by the controller 44. The decimated 8-bit logic signal is stored in the acquisition memory 30.

Since the operation of the acquisition systems 581-583 is the same as that of the acquisition system 580, no detailed description will be made. A trigger circuit is not shown in FIG. 5 but it controls which part of the signals is stored in the memory 30 similarly to the conventional mixed signal oscilloscopes. The stored logic signals corresponding to the logic input signals and/or the analog input signals are transferred form the acquisition systems 580-583 to the display controller/memory 42 in order to display the analog waveforms and/or digital waveforms on the display screen 18.

The above-described operation will be summarized, as follows. By connecting both the analog channel (through an A/D converter) and the digital channels to the acquisition system, the user can configure the input for the user's application by simply connecting the correct probe. If analog acquisition is desired, a traditional analog probe is connected. If digital probing is desired, a digital acquisition probe is connected. In a 4 channel oscilloscope, it can be seen that the user can get up to 32 digital channels if desired. Additional input channels increases the versatility of the present invention. It should be noted that nothing prohibits the addition of "dedicated" logic channels in addition to those provided by the present invention. It might also be reasonable to add logic channel capabilities to an auxiliary input interface for an external trigger input or the like, if it were otherwise connected to memory.

Figure 7:
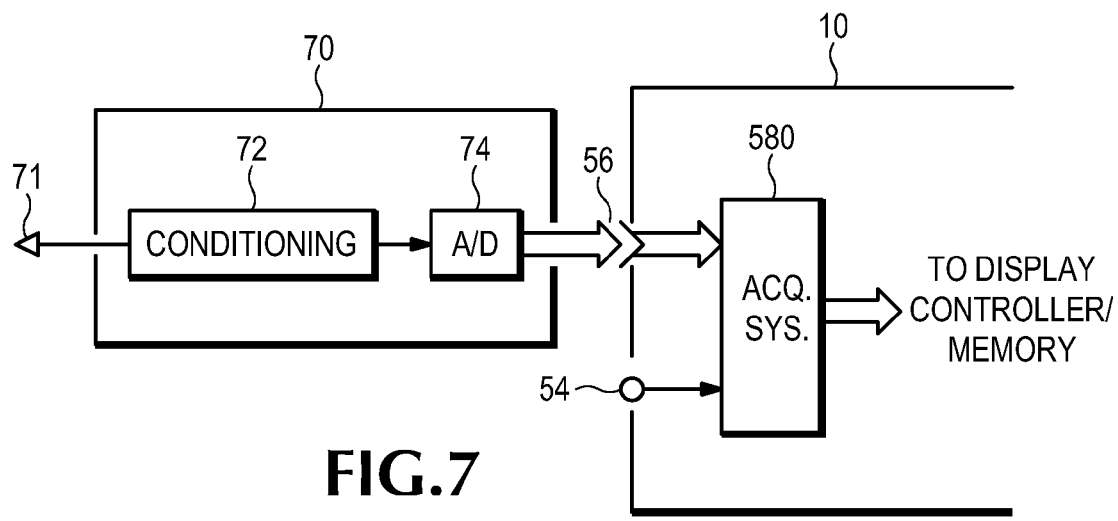
FIG. 7 is a simplified block diagram of another embodiment according to the present invention wherein an external high resolution A/D converter is applied.

The number of the digital bits for each acquisition system is 8, in FIGS. 4, 5 and 6, but it may be another number. When the vertical resolution is desired to higher than that of the A/D converter 26, the present invention can be applied as shown in FIG. 7. A high vertical resolution probe 70 comprises a probe tip 71, a conditioning circuit 72 receiving an analog signal from the probe tip 71 and an M-bit A/D converter 74 for converting the analog signal from the conditioning circuit 72 into an M-bit digital signal. The M is a positive integer larger than the number of the channels in the logic input interface 56 and the M is, for example, sixteen. In this case, the 16-bit digital signal is divided into two groups of 8-bit digital signals, which will be further discussed hereinafter. The digital signals are transferred through the logic input interface 56 or the eight logic terminals 560-567 to the eight latch circuits 340-347 of the acquisition system 580. The multiplexer 52 selects the eight latch circuits 340-347. The high vertical resolution probe 70 may receive a power and a clock signal from the measurement instrument 10 via the auxiliary contacts 22. Since the output from the high resolution A/D converter 74 can be routed down the logic signal path (interleaved so that it fits onto the 8-bit interface), the signal multiplexer 52 may be modified to deal with this interleaved data, feeding it into the decimator 28 as if it were internally-generated data. In this embodiment, it should be noted that the sample rate of the external high-resolution A/D converter 74 would be no greater than ½ of the sample rate of the clock signal from the clock generator 40 in the measurement instrument 10, and this data could then be sent down the 8-bit data path in a MSB0, LSB0, MSB1, LSB1, . . . format. The decimator 28 may be designed to pick apart this data stream to re-create the 16-bit samples which would be decimated like normal A/D samples. The vertical resolution of the external A/D converter 74 may be 10, 12, 14, or 16 bits.

Figure 8:
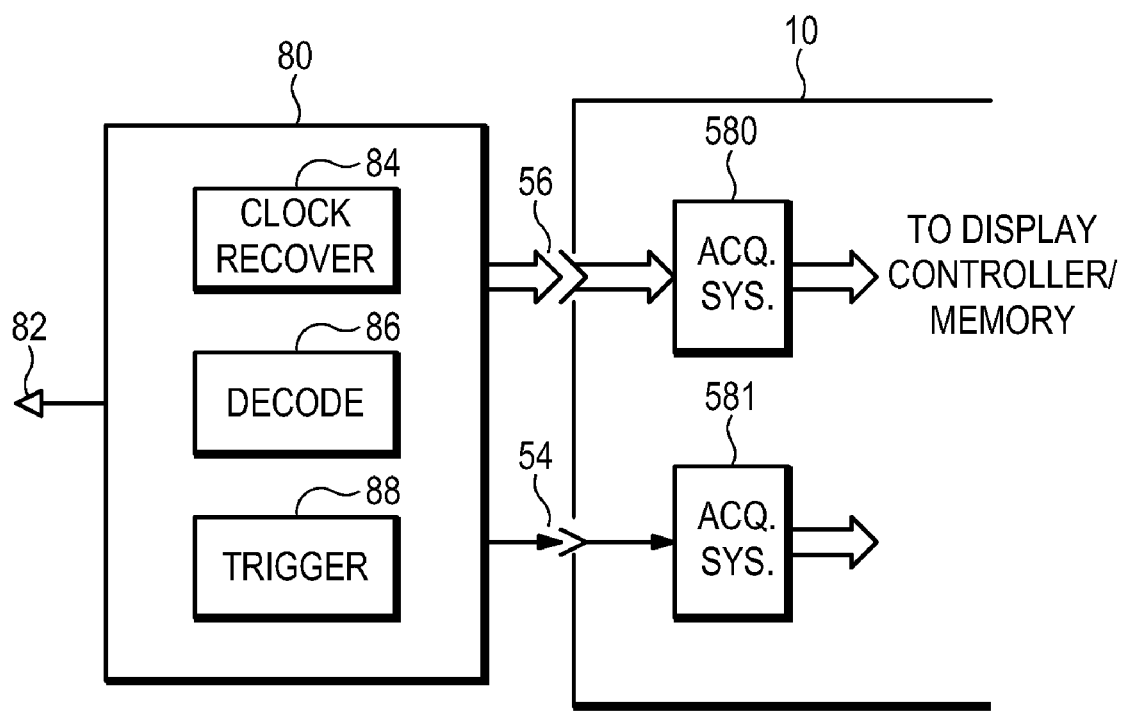
FIG. 8 is a simplified block diagram of a further embodiment according to the present invention wherein a serial data probe is applied.

Referring to FIG. 8, a high speed serial data probe can be realized by providing an external circuitry 80 having a clock recover function 84, a data decoding function 86 and a trigger event recognition function 88. The recovered clock is used by the functions 86 and 88. Any trigger event can be routed down the analog signal path via the analog input interface 54 for the acquisition system 581 where conventional oscilloscope processes can be used to register and process the event. The decoded data form the decoding function 86 can be routed down the logic signal path via the logic input interface 56 for the acquisition system 580, where it is stored in the memory 30. Minor changes to the acquisition system may be needed to support the capabilities of the serial data probe so that the trigger event can be used as a trigger.

Thus, the present invention provides a system and method for allowing the user to configure the instrument, with respect to the number of analog and digital channels in use. In addition, a method of the present invention provides specialized acquisition capabilities in the form of an accessory for mainstream mixed domain oscilloscopes.

Although various embodiments, which incorporate the teachings of the present invention have been shown and described in detail herein, those skilled in the art will readily understand that many other varied embodiments would still incorporate these teachings. For example, the analog and logic interfaces can be configured so that only only an analog probe, or only a logic probe, may be connected to the interface, at any given time. Alternatively, both an analog probe and a logic probe may be connected to the analog and logic interfaces of a given channel simultaneously, and the multiplexer for that channel may be controlled to select either analog probe or the logic probe.

What is claimed is:

1. A mixed signal acquisition system for a measurement instrument, comprising:
   an analog input interface mounted on a panel of said measurement instrument for receiving an analog signal;
   an analog-to-digital converter for converting the analog input signal from said analog input interface to an N-bit digital signal wherein N is a positive integer:
   a logic input interface mounted on the panel of said measurement instrument and having N terminals for receiving logic signals;
   N latch circuits for latching the logic signals from said N logic input terminals respectively;
   a multiplexer for selecting one of the N-bit digital signal from said analog-to-digital converter and the N logic signals from said N latch circuits; and
   a memory for storing the output from multiplexer; and
   wherein said multiplexer selects the analog input signal when the analog input signal is applied to said analog input interface and said multiplexer selects the logic input signals when the logic input signal is applied to said logic input interface.

2. The mixed signal acquisition system as recited in claim 1, further comprising:
   a clock generator for generating a clock signal to be applied to said analog-to-digital converter and said N latch circuits.

3. The mixed signal acquisition system as recited in claim 1, wherein said N logic input terminals are provided adjacent to said analog input interface.

4. The mixed signal acquisition system as recited in claim 1, further comprising:
   a decimator coupled between said multiplexer and said memory.

5. A measurement instrument for measuring mixed signals, comprising:
   a plurality of acquisition systems for acquiring the mixed signals;
   a display system for displaying the mixed signals acquired by said acquisition systems;
   each of said acquisition systems including:
   an analog input interface mounted on a panel of said measurement instrument for receiving an analog signal;
   an analog-to-digital converter for converting the analog input signal from said analog input interface to an N-bit digital signal wherein N is a positive integer:
   a logic input interface mounted on the panel of said measurement instrument and having N terminals for receiving logic signals;
   N latch circuits for latching the logic signals from said N logic input terminals respectively;
   a multiplexer for selecting one of the N-bit digital signal from said analog-to-digital converter and the N logic signals from said N latch circuits; and
   a memory for storing the output from multiplexer; wherein
   in each said acquisition system said multiplexer selects the analog input signal when the analog input signal is applied to said analog input interface and said multiplexer selects the logic input signals when the logic input signal is applied to said logic input interface.

6. The measurement instrument as recited in claim 5, further comprising:
   a clock generator for generating a clock signal to be applied to said analog-to-digital converters and said N latch circuits of said acquisition systems.

7. The measurement instrument as recited in claim 5, wherein said N logic input terminals are provided adjacent to said analog input interface in each said acquisition system.

8. The measurement instrument as recited in claim 5 wherein each said acquisition system further comprises a decimator coupled between said multiplexer and said memory.

9. A method of acquiring mixed signals, comprising the steps of:
   converting an analog input signal into an N-bit digital signal by a first analog-to-digital converter when the analog input signal is applied to an analog input interface wherein N is a positive integer;
   latching N logic signals by N latch circuits when the N logic signals are applied to N logic input terminals;
   selecting one of the N-bit digital signal from said analog-to-digital converter and the N logic signals from said N latch circuits by a multiplexer; and
   storing the output signals from multiplexer in a memory;
   and further comprising the steps of:
   converting the analog input signal into an M-bit digital signal by a second analog-to-digital converter instead of said first analog-to-digital converter wherein M is a positive integer larger than N; and transmitting the M-bit digital signal via said N logic input interface, said N latch circuits to said multiplexer in an interleave manner.

10. The method as recited in claim 9, wherein N is 8 and M is 16.

11. The method as recited in claim 9, further comprising the steps of:

recovering a clock signal from a serial logic signal;

decoding the serial logic signal;

recognizing a trigger event from the serial logic signal;

transmitting the decoded signal via said logic input interface to a measurement instrument; and transmitting the trigger event via said analog input interface to said measurement instrument.

* * * * *